(12) United States Patent
Fujisawa

(10) Patent No.: US 9,473,146 B2
(45) Date of Patent: Oct. 18, 2016

(54) APPARATUSES AND METHODS FOR LOW POWER COUNTING CIRCUITS

(71) Applicant: MICRON TECHNOLOGY, INC., Boise, ID (US)

(72) Inventor: Hiroki Fujisawa, Sagamihara (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/613,192

(22) Filed: Feb. 3, 2015

(65) Prior Publication Data

US 2016/0226495 A1  Aug. 4, 2016

(51) Int. Cl.
- H03B 19/00 (2006.01)
- H03K 23/40 (2006.01)
- H03K 21/02 (2006.01)

(52) U.S. Cl.
CPC ............ *H03K 23/40* (2013.01); *H03K 21/026* (2013.01)

(58) Field of Classification Search
USPC ........ 327/355–361, 202, 203, 208–212, 218, 327/105–123, 141, 144–163; 377/47, 48; 331/1 A, 15–17; 375/373–376
See application file for complete search history.

(56) References Cited

U.S. PATENT DOCUMENTS

| | | | | | |
|---|---|---|---|---|---|
| 4,206,414 A | * | 6/1980 | Chapman | ................ | H04L 7/033 324/76.82 |
| 6,052,004 A | * | 4/2000 | Saeki | ................ | H03K 5/00006 327/116 |
| 6,087,864 A | * | 7/2000 | Aoki | .................. | H03K 5/00006 327/116 |
| 6,298,106 B1 | * | 10/2001 | Hernandez Gamazo | . | H03L 7/18 327/159 |
| 6,346,833 B1 | * | 2/2002 | Kuroki | ....................... | G06F 7/68 327/116 |
| 6,545,518 B2 | * | 4/2003 | Saeki | ........................ | G06F 7/68 327/116 |
| 7,103,855 B2 | * | 9/2006 | Saeki | ........................ | G06F 1/06 327/149 |
| 8,044,723 B2 | * | 10/2011 | Kim | ........................ | H03K 7/107 327/156 |
| 2003/0200518 A1 | * | 10/2003 | Saeki | ........................ | G06F 1/06 327/149 |
| 2006/0273833 A1 | * | 12/2006 | Chen | .................... | H03K 5/1565 327/116 |
| 2009/0154629 A1 | * | 6/2009 | Pyeon | .................. | G06F 13/1689 375/376 |
| 2010/0225361 A1 | * | 9/2010 | Rhee | ..................... | H03K 23/667 327/105 |
| 2011/0169582 A1 | * | 7/2011 | Kim | ..................... | H03C 3/0916 331/1 R |

* cited by examiner

*Primary Examiner* — Brandon S Cole
(74) *Attorney, Agent, or Firm* — Dorsey & Whitney LLP

(57) ABSTRACT

Apparatuses and methods for low power counting circuits are described herein. An example apparatus may include a frequency divider configured to receive an input clock signal and adjust a frequency of the clock signal to provide an intermediate clock signal. The apparatus may further include a counter coupled to the frequency divider and configured to receive the intermediate clock signal. The counter may further be configured to provide a plurality of timing signals based on the intermediate clock signal. The apparatus may further include a frequency multiplier including a plurality of logic gates. Each of the plurality of logic gates may be coupled to the counter and configured to receive a respective first timing signal of the plurality of timing signals and at least one of the intermediate clock signal or a respective second timing signal of the plurality of timing signals.

32 Claims, 9 Drawing Sheets

APPARATUSES AND METHODS FOR LOW POWER COUNTING CIRCUITS

BACKGROUND

In a majority of memory systems (DRAM or Flash memory systems etc.), counting circuits may be implemented to track the number of times a signal, such as a clock signal, transitions between particular logic levels during operation. For example, a clock signal may periodically transition from a low logic level to a high logic level (e.g., a rising transition), and also periodically transition from the high logic level to the low logic level (e.g., a falling transition). Conventional approaches for counting transitions in this manner, however, typically are associated with relatively high power demands and large circuit footprints. Briefly, conventional counting circuits having these relatively high power and size requirements are not practical for some devices, such as mobile devices, which trend toward progressively higher operating frequencies and smaller form factors.

DETAILED DESCRIPTION

Apparatuses and methods for low power counting circuits are described herein. Certain details are set forth below to provide a sufficient understanding of embodiments of the invention. However, it will be clear to one having skill in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Figure 1:
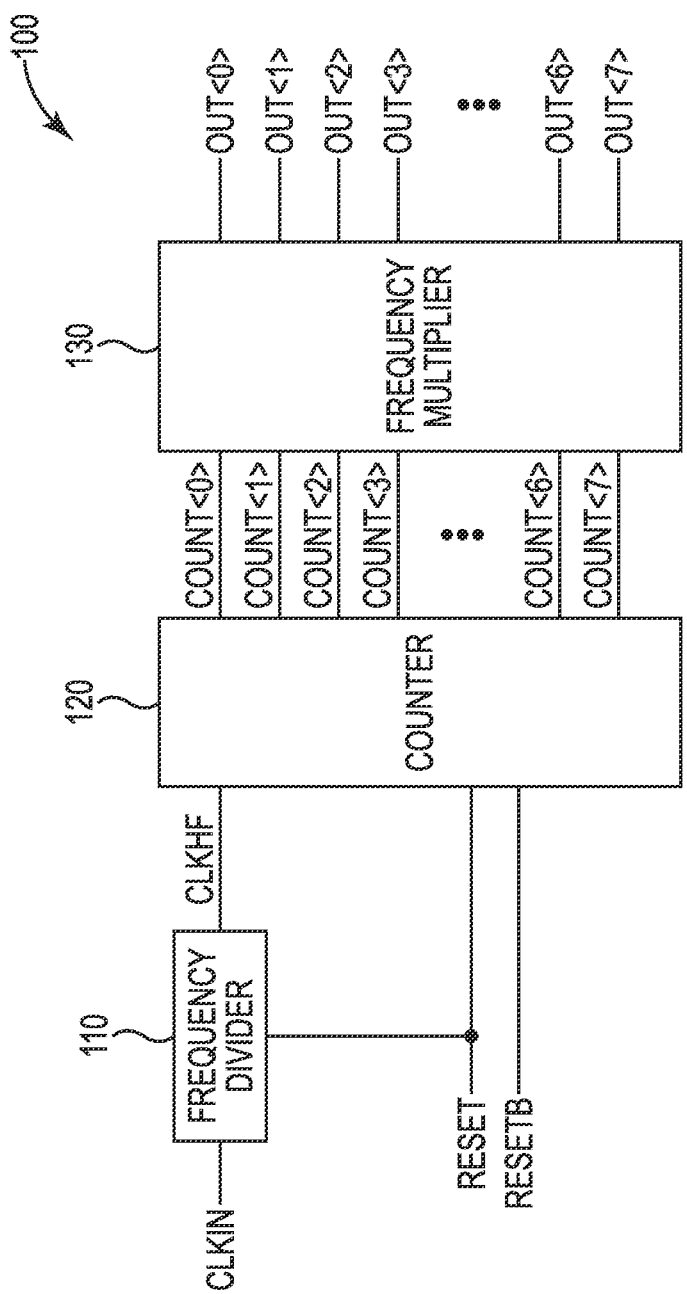
FIG. 1 is a schematic block diagram of a counting circuit according to an embodiment of the present invention.

FIG. 1 is a block diagram of a counting circuit 100 included in an apparatus according to an embodiment of the present invention. The apparatus may comprise circuitry, one or more semiconductor die, a packaged semiconductor, a device including such circuitry, die, or package, and/or a system including such a device. The counting circuit 100 may include a frequency divider 110, a counter 120, and a frequency multiplier 130.

The frequency divider 110 may be any frequency divider known in the art, including but not limited to an analog or digital clock signal divider. Accordingly, the frequency divider 110 may be configured to receive the input clock signal CLKIN and adjust (e.g., decrease) the frequency of the clock signal CLKIN to provide an intermediate clock signal CLKHF. By way of example, the frequency divider 110 may be configured to reduce the frequency of the clock signal CLKIN by a factor of 2. In other examples, the frequency divider 110 may be configured to decrease the frequency of the clock signal CLKIN by a factor of 4, 8, or any other integer or non-integer. The frequency divider 110 may receive the clock signal CLKIN at an input terminal and provide the clock signal CLKHF at an output terminal. In some examples, the frequency divider 110 may further be configured to provide the complement of the clock signal CLKHFB at another output terminal (not shown in FIG. 1). The frequency divider 110 may further be configured to receive a control signal RESET. Assertion of the control signal RESET may cause the frequency divider 110 to provide the clock signal CLKHF at a same logic value (e.g., logic low). The control signal RESET may be provided by a controller (not shown in FIG. 1) and may be asserted responsive to assertion of an external reset control signal.

Figure 5:
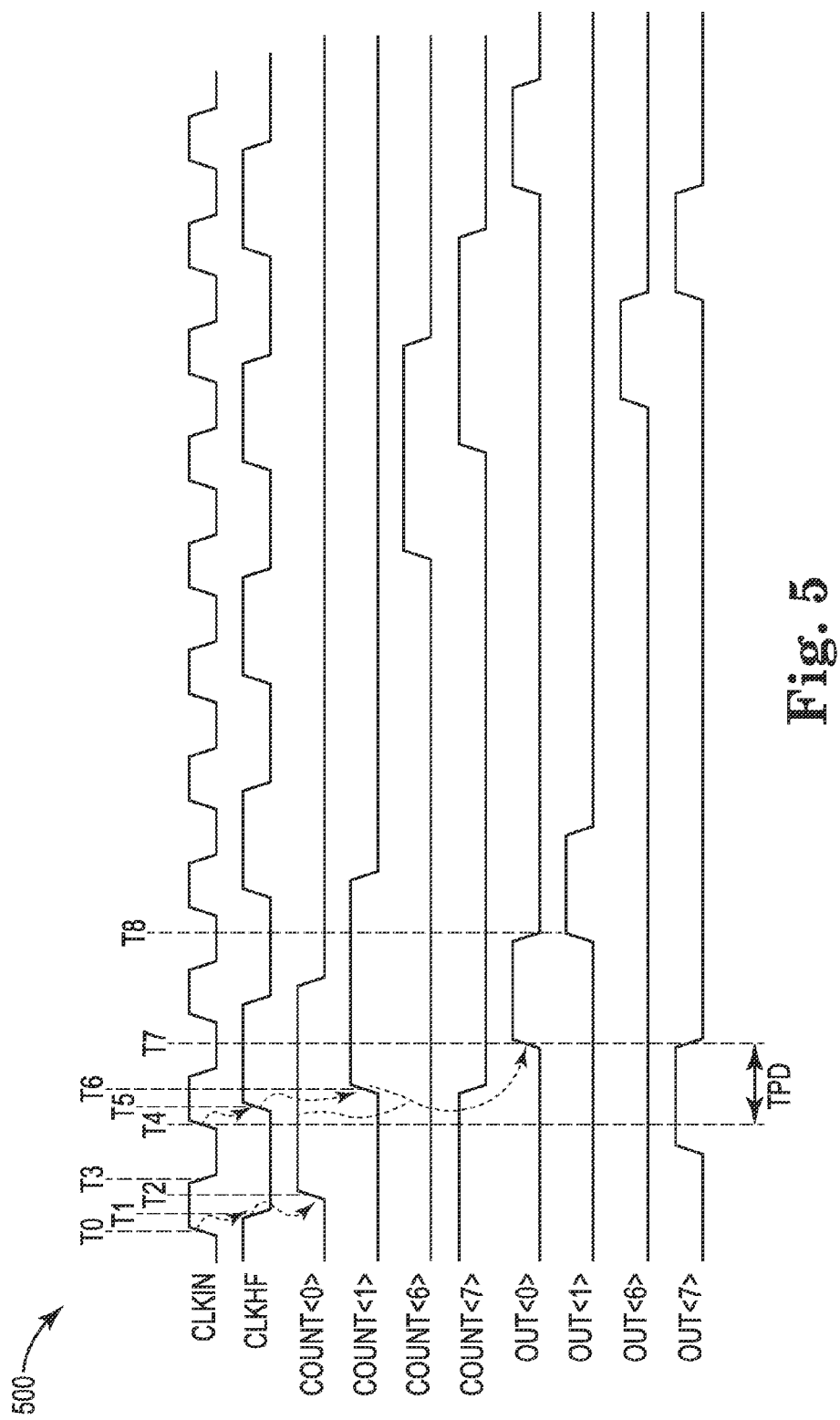
FIG. 5 is a timing diagram illustrating operation of a counting circuit according to an embodiment of the present invention.

The counter 120 may be a counter such as a binary counter, decade counter, and/or ring counter, and further may be coupled to the frequency divider 110. The counter 120 may be configured to receive the clock signal CLKHF and provide a plurality of timing signals COUNT based on the clock signal CLKHF. The counter 120 may, for instance, provide each of the plurality of timing signals at a respective output node. In some examples, the plurality of timing signals COUNT may be indicative of a number of transitions of the clock signal CLKHF. In another example, the plurality of timing signals COUNT may be indicative of a number of rising transitions or falling transitions of the clock signal CLKHF. The counter 120 may further be configured to receive the control signal RESET and a control signal RESETB. The control signal RESETB may, for instance, be a complement of the control signal RESET. Assertion of the control signal RESET may cause the counter 120 to provide each of the timing signals COUNT at a same logic value and/or reset a count of the counter 120. In the period that the control signal RESET is low and the inverted control signal RESETB is high, the counter 120 is activated to produce a plurality of timing signals as shown in FIG. 5. Although the counter 120 is illustrated in FIG. 1 as an 8-bit counter, it will be appreciated that in other examples the counter 120 may be a counter of any bit magnitude.

The frequency multiplier 130 may be coupled to the counter 120 and configured to receive the plurality of timing signals COUNT. The frequency multiplier 130 may further be configured to adjust (e.g., increase) a frequency of each of the plurality of timing signals COUNT to provide a respective plurality of output signals OUT. In some examples, the frequency multiplier 130 may be configured to receive each of the plurality of timing signals COUNT at a respective input node and provide each of the plurality of output signals OUT at a respective output node. As used herein, adjusting a frequency may include adjusting the duration a signal is asserted during operation and/or may include adjusting the period of a periodic signal. By way of example, the frequency multiplier 130 may be configured to increase the frequency by the same factor used by the frequency divider 110 to adjust the frequency of the clock signal CLKIN. In examples in which the frequency divider 110 reduces the frequency of the clock signal CLKIN by a factor of 2, for instance, the frequency multiplier 130 may increase the frequency of each of the plurality of timing signals COUNT by a factor of 2. In other examples, the frequency multiplier 130 may be configured to increase the frequency of each of the plurality of timing signals COUNT by a factor of 4, 8, or any other integer or non-integer.

In an example operation of the counting circuit 100, the clock signal CLKIN may be provided to the frequency divider 110. The frequency divider 110 may adjust the frequency of the clock signal CLKIN to provide the clock signal CLKHF. As described, adjusting the frequency of the clock signal CLKIN in this manner may include reducing the frequency of the clock signal CLKIN, for instance, by a factor of 2.

The counter 120 may receive the clock signal CLKHF from the frequency divider 110 and provide a plurality of timing signals COUNT based on the clock signal CLKHF. The frequency multiplier 130 may receive the plurality of timing signals COUNT from the counter 120 and adjust the frequency of each of the plurality of timing signals COUNT to provide a plurality of output signals OUT. Adjusting the frequency may include increasing the frequency of each timing signal COUNT, for instance, by a factor of 2. As a result, the frequency of the output signals OUT may be the same as the frequency of the clock signal CLKIN.

Briefly, in accordance with one or more examples described herein, a frequency of the clock signal CLKIN may be reduced to provide a clock signal CLKHF, a plurality of timing signals COUNT may be provided based on the clock signal CLKHF, and a frequency of each of the timing signals COUNT may be increased to provide the plurality of output signals OUT. As will be described in more detail, by providing the timing signals COUNT using a reduced frequency clock signal, the amount of power required to provide each of the plurality of timing signals COUNT may be reduced in comparison to conventional implementations.

Figure 2:
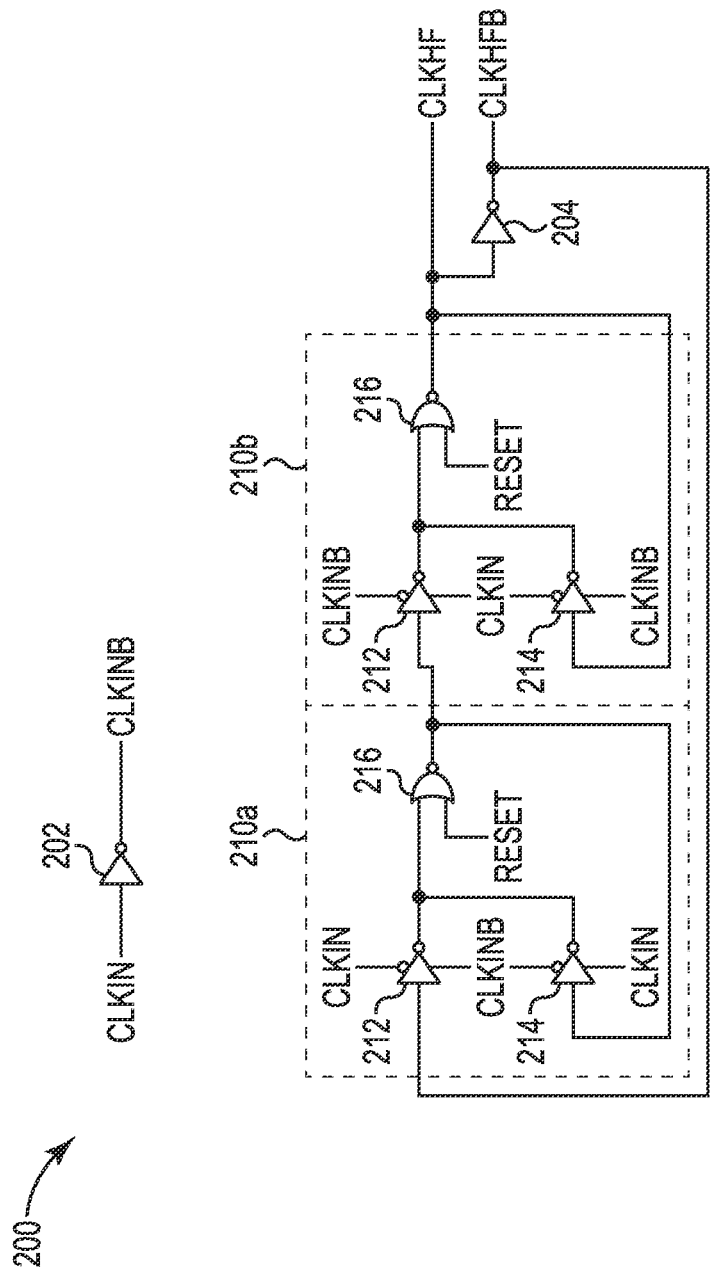
FIG. 2 is a schematic block diagram of a frequency divider according to an embodiment of the present invention.

FIG. 2 is a schematic block diagram of a frequency divider 200 according to an embodiment of the present invention. The frequency divider 200 may be used to implement the frequency divider 110 of FIG. 1. The frequency divider 200 may include inverters 202, 204, and clock division cells 210a,b. Each clock division cells 210 may include a respective pair of inverters 212, 214, and a NOR gate 216.

The inverter 202 may be configured to receive the clock signal CLKIN and invert the clock signal CLKIN to provide a clock signal CLKINB. Each pair of inverters 212, 214 of a respective clock division cell 210 may be configured to receive the clock signals CLKIN, CLKINB and further may be selectively enabled based on the clock signals CLKIN, CLKINB. In some examples, each pair of inverters 212, 214 may be configured such that only one inverter of the pair of inverters 212, 214 may be enabled at any one time. By way of example, the inverter 212 of the clock division cell 210a may be enabled during a first half of a clock cycle of the clock signal CLKIN while the inverter 214 of the clock division cell 210a may be enabled during a second half of a clock cycle of the clock signal CLKIN, and the inverter 212 of the clock division cell 210b may be enabled during a second half of a clock cycle of the clock signal CLKIN while the inverter 214 of the clock division cell 210b may be enabled during a first half of a clock cycle of the clock signal CLKIN.

Turning to the clock division cell 210a as an example, when the clock signal CLKIN is at a high logic level and the clock signal CLKINB is at a low logic level, the inverter 212 may be enabled and the inverter 214 disabled. As a result, the clock division cell 210a may provide the clock signal CLKHFB to the clock division cell 210b (via the NOR gate 216). Again with reference to the clock division cell 210a, when the clock signal CLKINB is at a high logic level and the clock signal CLKIN is at a low logic level, the inverter 214 may be enabled and the inverter 212 disabled. As a result, the clock signal CLKHFB may be fed back through the inverter 214 and latched by the clock division cell 210a. The clock division cell 210b operates similarly to the clock division cell 210a previously described, however, with the inverter 212 enabled and the inverter 214 disabled when the clock signal CLKIN is at a high logic level and the CLKINB signal is at a low logic level, and with the inverter 214 enabled and the inverter 212 disabled when the clock signal CLKIN is at a low logic level and the CLKINB signal is at a high logic level. In this manner, each clock division cell 210 may operate as a latch (e.g., D latch) configured to sample and latch an input signal based on the clock signals CLKIN, CLKINB.

The clock division cells 210a,b may be arranged in a series-coupled configuration and as a result may be configured to operate together as a flip-flop (e.g., a D flip-flop). As a result, because the clock signal CLKHFB may be provided (e.g., back fed) from the clock division cell 210b to the clock division cell 210a, the frequency divider 200 may serve to adjust a frequency of the clock signal CLKIN. As described, the frequency divider 200 may decrease a frequency of the clock signal CLKIN by a factor of 2. It will be appreciated that in some examples additional clock division cells 210 and/or other control logic may be included in the frequency divider 200 such that the frequency of the clock signal CLKIN may be adjusted by any amount desired.

Each NOR gate 216 of a respective clock division cell 210 may be configured to receive the control signal RESET and responsive to assertion of the control signal RESET, each NOR gate 216 may provide its output at a particular logic level (e.g., logic low). As a result, the clock signal CLKHF may, for instance, by provided by the frequency divider 200 at a constant logic level. In this manner, each NOR gate 216 may operate as a reset and/or initialization mechanism for each clock division cell 210.

Figure 3:
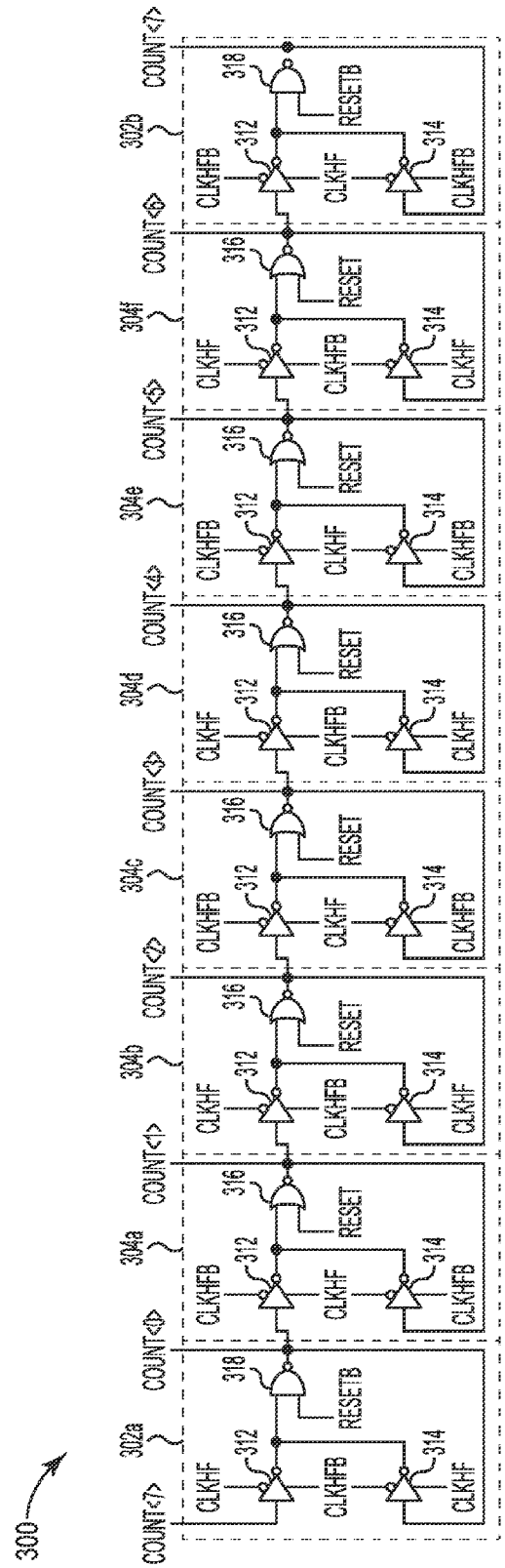
FIG. 3 is a schematic block diagram of a counter according to an embodiment of the present invention.

FIG. 3 is a schematic block diagram of a counter 300 according to an embodiment of the present invention. The counter 300 may be used to implement the counter 120 of FIG. 1. The counter 300 may include counter cells 302 and 304. Each of the counter cells 302a,b may include inverters 312, 314, and a NAND gate 318. Each of the counter cells 304a-f may include inverters 312, 314, and a NOR gate 316.

Each pair of inverters 312, 314 of a respective counter cell 302, 304 may be configured to receive the clock signals CLKHF, CLKHFB and further may be selectively enabled based on the clock signals CLKHF, CLKHFB. In some examples, each pair of inverters 312, 314 may be configured such that only one inverter of the pair of inverters 312, 314 may be enabled at any one time. By way of example, the inverter 312 of the counter cell 302a may be enabled during a first half of a clock cycle of the clock signal CLKHF while the inverter 314 of the counter cell 302a may be enabled during a second half of a clock cycle of the clock signal CLKHF. The inverter 312 of the counter cell 302a may be enabled during a second half of a clock cycle of the clock signal CLKHF while the inverter 314 of the counter cell 302a may be enabled during a first half of a clock cycle of the clock signal CLKHF.

Turning to the counter cell 302a as an example, when the clock signal CLKHF is at a low logic level and the clock signal CLKHFB is at a high logic level, the inverter 312 may be enabled and the inverter 314 may be disabled. As a result, the counter cell 302a may provide the timing signal COUNT<0> to the counter cell 304a (via the NAND gate 318). When the clock signal CLKHFB is at a low logic level and the clock signal CLKHF is at a high logic level, the inverter 314 may be enabled and the inverter 312 disabled. As a result, the timing signal COUNT<0> may be back fed to the inverter 314 and latched by the counter cell 302a. In this manner, the counter cell 302a may operate as a latch configured to alternatively sample and latch an input signal based on the clock signals CLKHF, CLKHFB.

Each counter cell 302, 304 may be configured to operate in accordance with the example functionality described with reference to the counter cell 302a. That is, each counter cell 302, 304 may sample and latch a respective timing signal of the plurality of timing signals COUNT based on the clock signals CLKHF, CLKHFB. For example, the counter cells 302a, 304b, 304d, and 304f sample an input timing signal through the respective inverter 312 responsive to the clock signal CLKHF having a low logic level and the clock signal CLKHFB having a high logic level, and latch the respective timing signal responsive to the clock signal CLKHF having the high logic level and the clock signal CLKHFB having the low logic level. The counter cells 304a, 304c, 304e, and 302b sample an input timing signal through the respective inverter 312 responsive to the clock signal CLKHF having a high logic level and the clock signal CLKHFB having a low logic level, and latch the respective timing signal responsive to the clock signal CLKHF having the low logic level and the clock signal CLKHFB having a high logic level.

Each NOR gate 316 of a respective counter cell 304 may be configured to receive the control signal RESET and responsive to assertion of the control signal RESET, may provide a respective timing signal of the plurality of timing signals COUNT at a particular value (e.g., logic low). In this manner, each NOR gate 316 may operate as a reset and/or initialization mechanism for a respective counter cell 304. Similarly, each NAND gate 318 of a respective counter cell 302 may be configured to receive the complement of the control signal RESET, RESETB, and responsive to assertion of the control signal RESETB (e.g., at a logic low), may provide a respective timing signal of the plurality of timing signals COUNT at a particular value (e.g., logic high). In this manner, each NAND gate 318 may operate as a reset and/or initialization mechanism for each counter cell 302.

In operation, as the clock signals CLKHF and CLKHFB transition between the high logic level and the low logic level, the timing signals are propagated through the counter cells 302 and 304 to provide an incrementing count value including the timing signals COUNT<0> through COUNT <7>. For example, upon asserting the control signal RESET the count value is set to zero, and thereafter, with transitions of the clock signals CLKHF and CLKHFB the count value increments by one until a count value of 1111 1111 is reached. At that time, the following increment of the count value returns to zero. The count value increments once every clock cycle of the clock signals CLKHF and CLKHFB.

Figure 4:
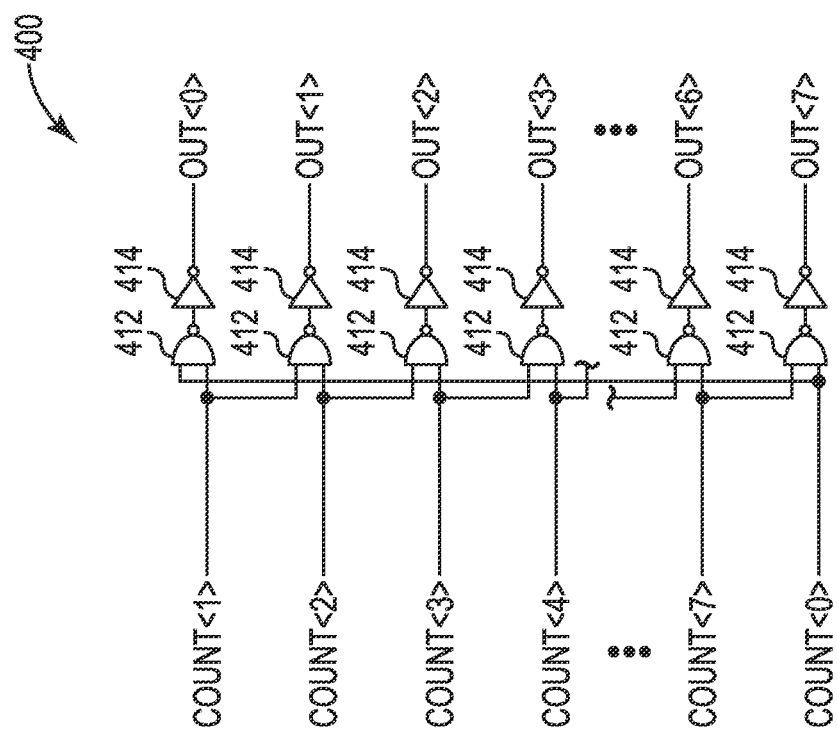
FIG. 4 is a schematic block diagram of a frequency multiplier according to an embodiment of the present invention.

FIG. 4 is a schematic block diagram of a frequency multiplier 400 according to an embodiment of the present invention. The frequency multiplier 400 may be used to implement the frequency multiplier 130 of FIG. 1. The frequency multiplier 400 may include a plurality of NAND gates 412 and a plurality of inverters 414.

Each NAND gate 412 may be configured to receive a respective pair of the plurality of timing signals COUNT. By way of example, as illustrated, each NAND gate 412 may receive an $i^{th}$ timing signal COUNT (e.g., COUNT<3>) and an $i^{th}$+1 timing signal count (e.g., COUNT<4>). The output of each NAND 412 may be provided to a respective inverter 414, which may in turn provide a respective output signal (e.g., OUT<3>) of the plurality of output signals OUT.

In some examples, each of the timing signals COUNT provided by a counter, such as the counter 120 of FIG. 1, may have a width (e.g., measured between rising transitions of the timing signal, or between falling transitions of the timing signal) corresponding to the clock cycles of the clock signal provided to the counter (e.g., CLKHF), which is twice the clock cycle of the input clock signal CLKIN. As will be explained in more detail, based on the output signals COUNT, the frequency multiplier 400 may be configured to provide the plurality of output signals OUT with each output signal OUT having a width corresponding to one clock cycle of the input clock signal CLKIN, that is, the frequency of the signal transitions of the output signals OUT is the same as the clock transitions of the input clock signal CLKIN.

In operation, as the timing signals COUNT transition between a high logic level and a low logic level, the NAND gates 412 will provide output signals to the inverters 414 that transition between a high logic level and a low logic level at twice the frequency at which the timing signals COUNT transition due to the NAND logic operation. In effect, the frequency multiplier 400 provides output signals OUT having a higher frequency than the timing signals COUNT.

FIG. 5 is a timing diagram 500 illustrating operation of a counting circuit according to an embodiment of the present invention. By way of example, operation is described with reference to the counting circuit 100.

An input clock signal CLKIN is provided to the frequency divider 110 of the counting circuit 100.

At time T0, the clock signal CLKIN transitions to a high logic level, and in response the frequency divider 110 may provide a clock signal CLKHF having a transition to a low logic level.

At time T2, responsive to the transition of the clock signal CLKHF, the counter 120 may provide a timing signal COUNT<0> having a transition to a high logic level. By way of example, with reference to FIG. 3, the transition of the clock signal CLKHF to a low logic level may cause the inverter 312 of the counter cell 302a to be enabled and the inverter 314 of the counter cell 302a to be disabled. Accordingly, the counter cell 302a may provide the timing signal COUNT<7> as the timing signal COUNT<0>.

At time T3, referring back to FIG. 5, the clock signal CLKIN may transition to a low logic level. As described, the clock signal CLKIN may be provided to the frequency divider 110 and the frequency divider may reduce the frequency of the clock signal CLKIN, for instance, by a factor of 2. As a result, the clock signal CLKHF may remain at a low logic level at time T3. Responsive to a transition of the clock signal CLKIN to a high logic level at time T4, the clock signal CLKHF may transition to a high logic level at time T5.

At time T6, the counter 120 may provide the timing signal COUNT<1> that transitions to a high logic level. With reference to FIG. 3, for example, the transition of the clock signal CLKHF may cause the inverter 312 of the counter cell 304a to be enabled and the inverter 314 of the counter cell 304a to be disabled. Accordingly, the counter cell 304a may provide the timing signal COUNT<0> as the timing signal COUNT<1>. The transition of the clock signal CLKHF may further cause the inverter 312 of the counter cell 302a to be disabled and the inverter 314 of the counter cell 302a to be enabled. As a result, the counter cell 302a may latch the COUNT<0> signal at a high logic level such that the timing signal COUNT<0> remains at a high logic level despite a transition of the timing signal COUNT<7> to a low logic level.

Responsive to both timing signals COUNT<0> and COUNT<1> having high logic levels, at time T7, the frequency multiplier 130 may provide an output signal OUT<0> having a high logic level. For example, with reference to FIG. 4, each of the timing signals COUNT<0> and COUNT<1> may be provided to a NAND gate 412, the output of which may in turn be provided to an inverter 414. The inverter 414 provides an output signal OUT<0> having a high logic level. The time between the time T4 and the time T7 may correspond to a time Tpd, which may represent the time between a transition of the clock signal CLKIN and transition of a next output signal OUT (e.g., OUT<0>) to a high logic level, which is caused by the transition of the clock signal CLKIN.

In this manner, each of the timing signals COUNT may iteratively transition to a high logic level (e.g., COUNT<0>, COUNT<1>, COUNT<2>, and so on) in sequential manner such that each of the output signals OUT also transitions to a high logic level sequentially. Because, however, each of the output signals OUT transition to a high logic level responsive to two timing signals COUNT having a high logic level simultaneously, the output signals OUT may individually transition to a high logic level such that only a single output signal OUT transitions to a high logic level at a given time. For example, at a time T8, the output signal OUT<0> may transition to a low logic level and the output signal OUT<1> may transition to a high logic level in response to the timing signal COUNT<1> and the timing signal COUNT<2> (not shown in FIG. 5) having a high logic level.

In conventional systems, counting circuits may typically rely on a full pair of D latches (or a flip-flop) to provide each timing signal. In contrast, by reducing the frequency of a clock signal provided to a counter, for instance by a factor of 2, a single D latch may be used to provide each timing signal, and the number of D latches and signal transitions required for counter operation may be reduced. As a result, counting circuits implemented in accordance with examples described herein may operate with lower power consumption and require a smaller circuit footprint than conventional counting circuits.

Figure 6:
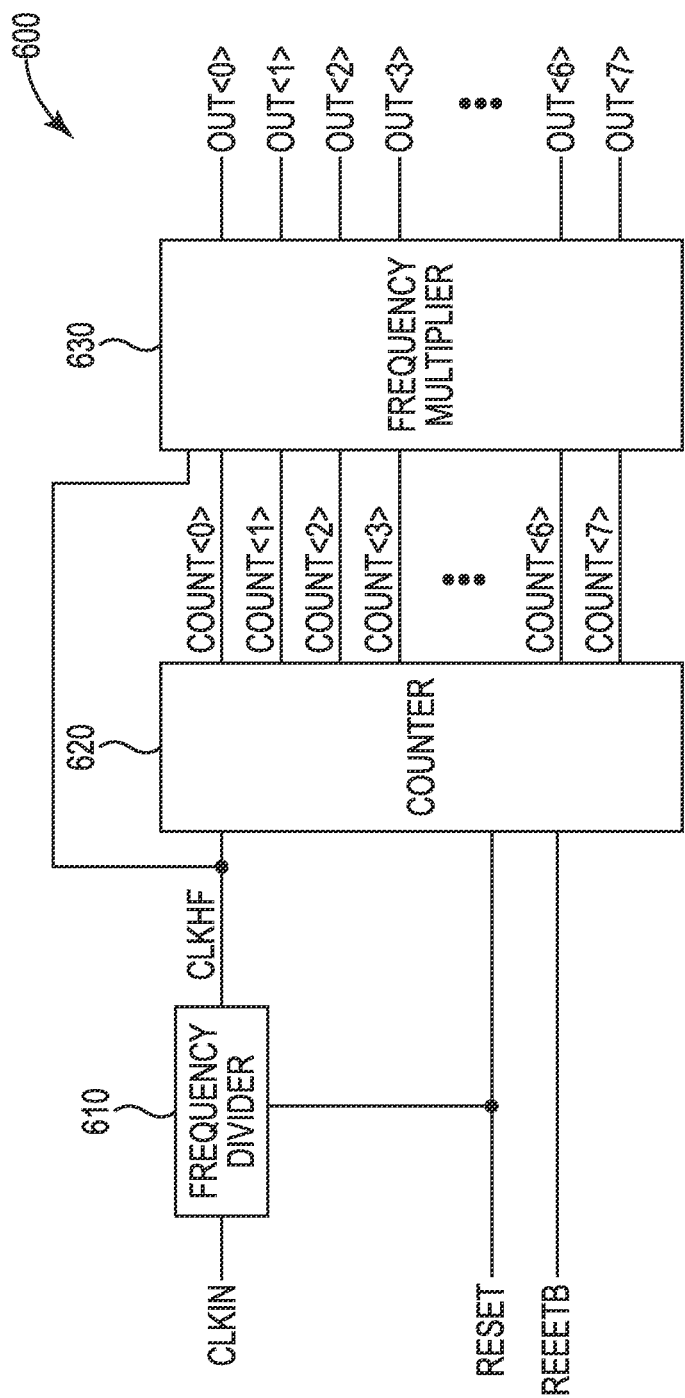
FIG. 6 is a schematic block diagram of a counting circuit according to an embodiment of the present invention.

FIG. 6 is a schematic block diagram of a counting circuit 600 included in an apparatus according to an embodiment of the present invention. The apparatus may comprise circuitry, one or more semiconductor die, a packaged semiconductor, a device including such circuitry, die, or package, and/or a system including such a device. The counting circuit 600 may include a frequency divider 610, a counter 620, and a frequency multiplier 630.

The frequency divider 610 may be any frequency divider known in the art, including but not limited to an analog or digital clock divider. In some examples, the frequency divider 610 may be implemented using the frequency divider 200 of FIG. 2. The frequency divider 610 may be configured to receive the clock signal CLKIN and adjust the frequency of the clock signal CLKIN to provide the intermediate clock signal CLKHF. The frequency divider 610 may receive the clock signal CLKIN at an input terminal and provide the clock signal CLKHF at an output terminal. In some examples, the frequency divider 610 may further be configured to provide the complement of the clock signal CLKHFB at another output terminal (not shown in FIG. 6). By way of example, the frequency divider 610 may be configured to reduce the frequency of the clock signal CLKIN by a factor of 2. In other examples, the frequency divider 610 may be configured to reduce the frequency of the clock signal CLKIN by a factor of 4, 8, or any other integer or non-integer. The frequency divider 610 may further be configured to receive a control signal RESET. Assertion of the control signal RESET, for instance, by a controller (not shown in FIG. 6) may cause the frequency divider 610 to provide the clock signal CLKHF at a same logic level.

The counter 620 may be a counter such as a binary counter, decade counter, and/or ring counter, and may be implemented using the counter 300 of FIG. 3. The counter 620 may be coupled to the frequency divider 610 and configured to receive the clock signal CLKHF, and further may be configured to provide a plurality of timing signals COUNT based on the clock signal CLKHF. The counter 620 may, for instance, provide each of the plurality of timing signals at a respective output node. As described, the plurality of timing signals COUNT may be indicative of a number of transitions of the clock signal CLKHF. In another example, the plurality of timing signals COUNT may be indicative of a number of rising transitions or falling transitions of the clock signal CLKHF. The counter 620 may further be configured to receive the control signal RESET and a control signal RESETB. The control signal RESETB may, for instance, be a complement of the control signal RESET. Assertion of the control signal RESET may cause the counter 620 to provide each of the timing signals COUNT at a same logic value and/or reset a count of the counter 620.

The frequency multiplier 630 may be coupled to the counter 620 and configured to receive the plurality of timing signals COUNT, and may further be coupled to the frequency divider 610 and configured to receive the clock signal CLKHF. A circuit configuration to receive the clock signal CLKHF in FIG. 6 is different from a circuit configuration shown in FIG. 1.

The frequency multiplier 630 may be configured to adjust (e.g., increase) a frequency of each of the plurality of output signals OUT, for instance, based on the clock signal CLKHF, to provide a respective plurality of output signals OUT. The frequency multiplier 630 may be configured to receive each of the plurality of timing signals COUNT at a respective input node and provide each of the plurality of output signals OUT at a respective output node. As described, adjusting a frequency may include adjusting the duration a signal may be at a logic level (e.g., a high logic level or a low logic level) during operation and/or may include adjusting the period of a periodic signal. By way of example, the frequency multiplier 630 may be configured to increase the frequency by the same factor used by the frequency divider 610 to adjust the frequency of the clock signal CLKIN. In examples in which the frequency divider 610 reduces the frequency of the clock signal CLKIN by a factor of 2, for instance, the frequency multiplier 630 may increase the frequency of each of the plurality of timing signals COUNT by a factor of 2. In other examples, the frequency multiplier 630 may be configured to increase the frequency of each of the plurality of timing signals COUNT by a factor of 4, 8, or any other integer or non-integer.

In an example operation of the counting circuit 600, a clock signal CLKIN may be provided to the frequency divider 610. The frequency divider 610 may adjust the frequency of the clock signal CLKIN to provide the clock signal CLKHF. The counter 620 may receive the clock signal CLKHF from the frequency divider 610 and provide a plurality of timing signals COUNT based on the clock signal CLKHF.

The frequency multiplier 630 may receive the plurality of timing signals COUNT from the counter 620 and further receive the clock signal CLKHF from the counter 620. Based on the clock signal CLKHF, the frequency multiplier 630 may adjust the frequency of each of the plurality of timing signals COUNT to provide a plurality of output signals OUT. The frequency of the plurality of output signals OUT may be the same as the frequency of the clock signal CLKIN.

Figure 7:
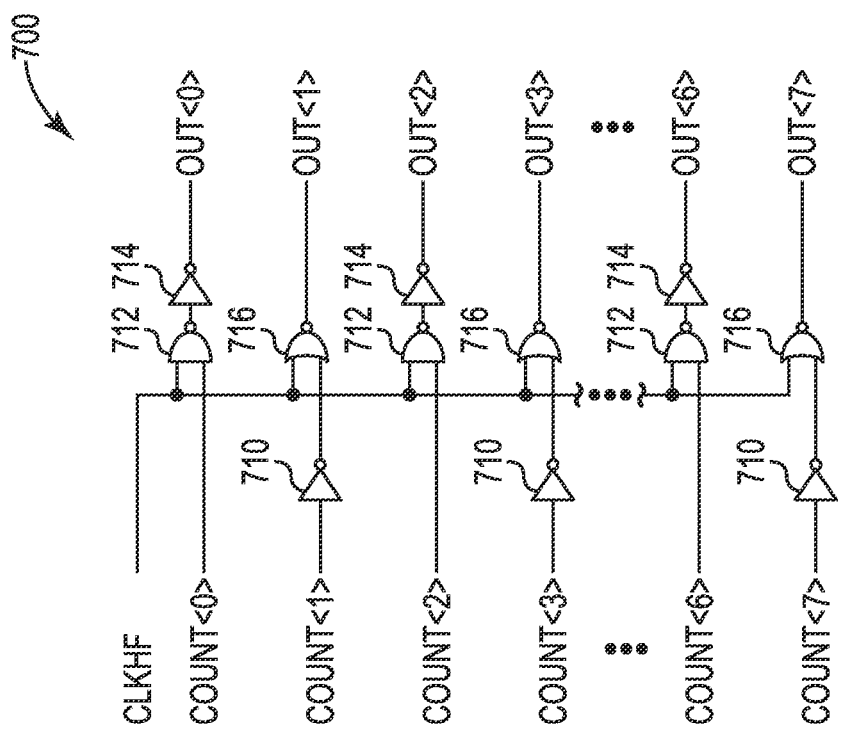
FIG. 7 is a schematic block diagram of a frequency multiplier according to an embodiment of the present invention.

FIG. 7 is a schematic block diagram of a frequency multiplier 700 according to an embodiment of the present invention. The frequency multiplier 700 may be used to implement the frequency multiplier 630 of FIG. 6. The frequency multiplier 700 may include inverters 710, 714, NAND gates 712, and NOR gates 716.

Each NAND gate 712 may be configured to receive the clock signal CLKHF and a respective timing signal COUNT (e.g., an even timing signal COUNT) and provide its output to an inverter 714. In turn, each inverter 714 may provide a respective output signal OUT (e.g., an even output signal OUT). Similarly, each inverter 710 may be configured to receive a respective timing signal COUNT (e.g., an odd timing signal COUNT) and provide its output to a NOR gate 716. Each NOR gate 716 may further receive the clock signal CLKHF and provide its output as a respective output signal OUT (e.g., an odd output signal OUT).

In some examples, each of the timing signals COUNT provided by a counter, such as the counter 620 of FIG. 6, may have a width (e.g., measured between rising transitions of the timing signal, or between falling transitions of the timing signal) corresponding to two clock cycles of the clock provided to the counter (e.g., CLKHF). As will be explained in more detail, based on the timing signals COUNT, the frequency multiplier 700 may be configured to provide the plurality of output signals OUT with each output signal OUT having a width corresponding to one clock cycle of the clock provided to the counter.

Figure 8:
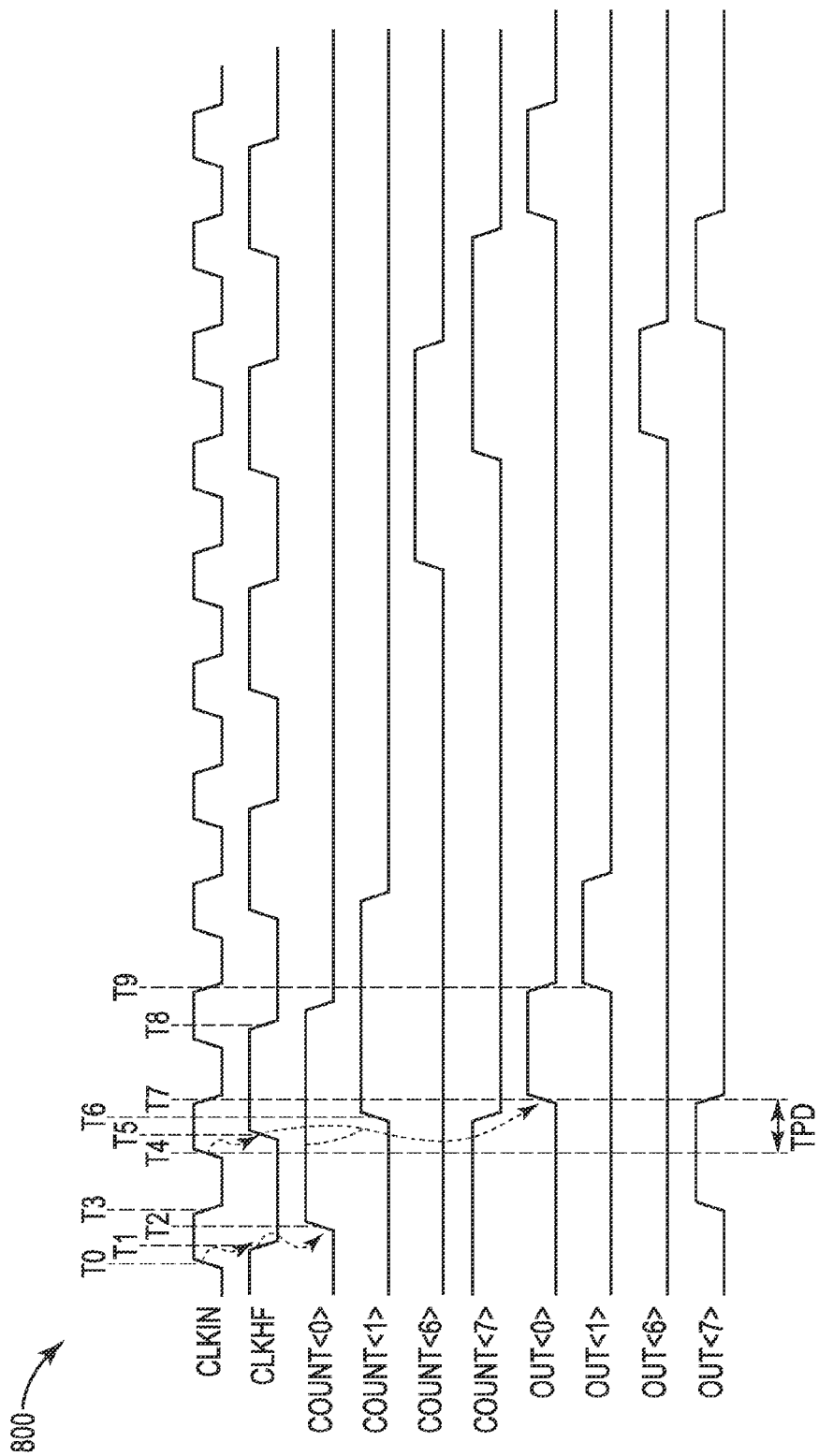
FIG. 8 is a timing diagram illustrating operation of a counting circuit according to an embodiment of the present invention.

FIG. 8 is a timing diagram 800 illustrating operation of a counting circuit according to an embodiment of the present invention. By way of example, operation is described with reference to the counting circuit 600.

An input clock signal CLKIN is provided to the frequency divider 610 of the counting circuit 600.

At time T0, the clock signal CLKIN transitions to a high logic level, and in response the frequency divider 610 may provide a clock signal CLKHF having a transition to a low logic level at time T1.

At time T2, responsive to the transition of the clock signal CLKHF, the counter 120 may provide a timing signal COUNT<0> having a transition to a high logic level. By way of example, with reference to FIG. 3, the transition of the clock signal CLKHF to a low logic level may cause the inverter 312 of the counter cell 302a to be enabled and the inverter 314 of the counter cell 302a to be disabled. Accordingly, the counter cell 302a may provide the timing signal COUNT<7> as the timing signal COUNT<0>.

At time T3, referring back to FIG. 5, the clock signal CLKIN may transition to a low logic level. As described, the clock signal CLKIN may be provided to the frequency divider 610 and the frequency divider may reduce the frequency of the clock signal CLKIN, for instance, by a factor of 2. As a result, the clock signal CLKHF may remain at a logic low level at time T3. Responsive to a transition of the clock signal CLKIN to a high logic level at time T4, the clock signal CLKHF may transition to a high logic level at time T5. At time T6, the timing signal COUNT<1> may be asserted.

Due to the high logic level of the clock signal CLKHF and the timing signal COUNT<0>, the frequency multiplier 630 may provide the output signal OUT<0> having a high logic level at time T7. With reference to FIG. 7, the timing signal COUNT<0> and the clock signal CLKHF may be provided to a NAND gate 712, whose output may in turn be provided to an inverter 714. The inverter 714 provides an output signal OUT<0> having a high logic level. The time between time T4 and time T7 may correspond to time Tpd, which may represent the time between a transition of the clock signal CLKIN and transition of a next output signal OUT (e.g., OUT<0>) to a high logic level, which is caused by the transition of the clock signal CLKIN.

At time T8, the clock signal CLKIN may transition to a low logic level, and at time T9, the output signal OUT<0> may transition to a low logic level. Moreover, the output signal OUT<1> may transition to a high logic level. With reference to FIG. 7, the timing signal COUNT<1> may be provided to an inverter 710, the output of which may in turn be provided to a NOR gate 716. The NOR gate 716 may further receive the clock signal CLKHF at a low logic level such that the output signal OUT<1> transitions to a high logic level.

In this manner, each of the timing signals COUNT may iteratively transition to a high logic level (e.g., COUNT<0>, COUNT<1>, COUNT<2>, and so on) in sequential manner such that each of the output signals OUT are transitions to a high logic level sequentially. Because each of the output signals OUT transition to a high logic level responsive to a timing signal COUNT having a high logic level and a transition of the clock signal CLKHF to a particular logic level, each respective output signal OUT has a high logic level only during a particular half of a clock cycle of the clock signal CLKHF. As a result, only a single output signal OUT may have a high logic level at a given time. For example, at the time T9, the output signal OUT<0> may transition to a low logic level and the output signal OUT<1> may transition to a high logic level in response to the timing signal COUNT<1> having a high logic level and a transition of the clock signal CLKHF to a low logic level.

As described with reference to FIG. 5, a respective output signal OUT may transition to a high logic level responsive to a respective pair of timing signals COUNT having a high logic level. Conversely, as described with reference to FIG. 8, the counting circuit 600 a respective output signal OUT may transition to a high logic level responsive to assertion of a respective timing signal COUNT having a high logic level and a transition of the clock signal CLKHF to a particular logic level. Accordingly, in some examples, the time Tpd associated with the counting circuit 600 may be shorter than the time Tpd associated with the counting circuit 100. This may result because the counting circuit 600 may provide an output signal OUT without the internal delay of a counter required to provide a second timing signal COUNT.

Figure 9:
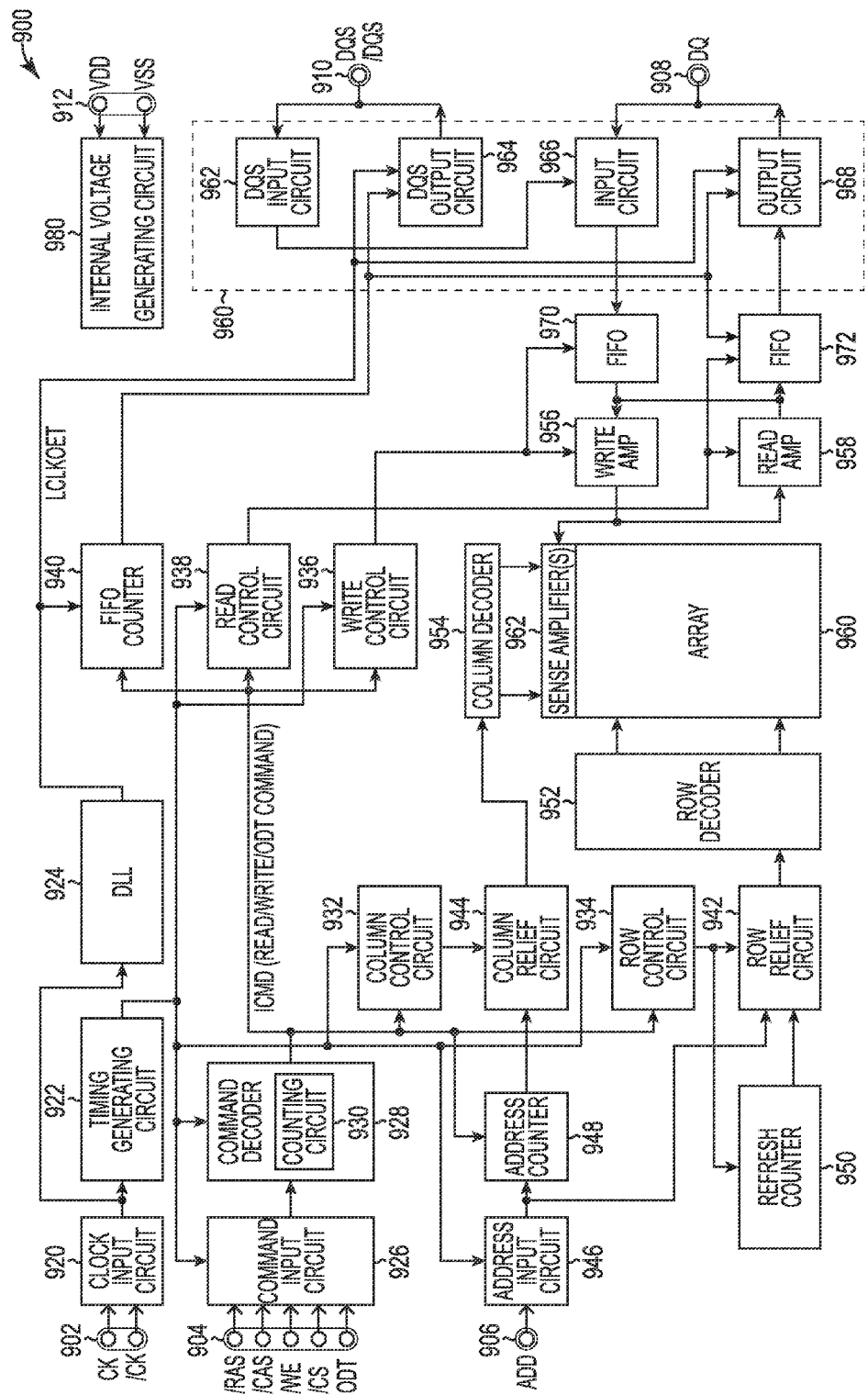
FIG. 9 is a schematic block diagram of a memory according to an embodiment of the present invention.

FIG. 9 is a schematic block diagram of a memory 900 according to an embodiment of the present invention. The memory 900 may be a synchronous DRAM, and may include one or more terminals for receiving respective signals. By way of example, terminals of the memory 900 may include clock terminals 902, command terminals 904, address terminals 906, a data input/output terminal 908, data strobe terminals 910, and power-supply terminals 912. In some examples, the memory 900 may further include a calibration terminal and/or a clock enable terminal (not shown in FIG. 9).

The clock terminals 902 may be terminals to which clock signals CK and /CK are respectively supplied. In some examples, the clock signals CK and /CK may be supplied to a clock input circuit 920, and further may be complementary. An output signal of the clock input circuit 920 may be supplied to each of a timing generating circuit 922 and a delay locked loop (DLL) circuit 924. The timing generating circuit 922 may be configured to generate an internal clock signal ICLK and supply the internal clock signal ICLK to various internal circuits of the memory 900, as illustrated. The DLL circuit 924 may be configured to generate an output clock signal LCLK and supply the output clock signal LCLK to one or more circuits of a data output system 960, such as a DQS output circuit 964 and an output circuit 968.

In some examples, the output clock signal LCLK may be provided by controlling phases of the clock signals CK and /CK. For instance, the output clock signal LCLK may be shifted relative to the clock signals CK and /CK such that a phase of the read data DQ (and data strobe signals DQS and /DQS) matches the phases of the clock signals CK and /CK.

The command terminals 904 may be supplied with respective signals including, but not limited to a row address strobe signal /RAS, a column address strobe signal /CAS, a write enable signal /WE, a chip select signal /CS, and an on die termination signal ODT. In turn, the command signals may be supplied to a command decoder 928 via a command input circuit 926. The command decoder may be configured to provide (e.g., generate) internal commands ICMD by performing a process of latching and/or decoding command signals and other processes in synchronization with the internal clock signal ICLK.

In some examples, the command decoder 928 may include a counting circuit 930. The counting circuit 930 may be implemented using one or more counting circuits described herein, such as the counting circuit 100 of FIG. 1 or the counting circuit 600 of FIG. 6. Among the internal commands ICMD, a column-related command is provided after additive latency AL is counted by the counting circuit 930. The counting circuit 100 of FIG. 1 or the counting circuit 600 of FIG. 6 may be used not only in DRAM device but also in the other type of memory device such as Flash, STT-RAM, ReRAM, PCM, and/or logic memory device.

Additionally, one or more output signals related to an internal command ICMD may be provided during operation of the counting circuit 930. The output signals provided in this manner may be provided to respective control circuits, including but not limited to a column control circuit 932, a row control circuit 934, a write control circuit 936, a read control circuit 938, a FIFO counter 940, and an address counter 948. A timing at which the counting circuit 930 provides the output signals can vary according to a present value AL.

The FIFO counter 940 may be configured to provide various timing signals after a read/write command is issued. Accordingly, each circuit block of a column system may operate at a predetermined timing.

The address terminal 906 may be supplied with an address signal ADD. Among the supplied address signals ADD, a row address is supplied to a row relief circuit 942 via an address input circuit 946. The address input circuit 946 may, for example, include a current mirror and make a determination primarily as to whether a signal supplied to the address terminal 906 is a binary "1" or "0." Among the address signals ADD supplied from the address input circuit 946, a column address is provided to the address counter 948. Moreover, a row address generated by a refresh counter 950 may also be provided to the row relief circuit 942.

When a row address indicating a defective word line is provided, the row relief circuit 942 may relieve the row address by accessing a redundant word line of the array 960 instead of the original word line of the array 960 indicated by the row address. An operation of the row relief circuit 942 may be controlled by the row control circuit 934, and an output of the row relief circuit may be provided to a row decoder 952. The row decoder 952 may be configured to select any one of word lines WL included in the array 960. In the array 960, a plurality of word lines WL and a plurality of bit lines BL may be arranged in a grid configuration, and memory cells MC may be disposed at points of intersection between the word lines WL and the bit lines BL, respectively. The bit lines BL are connected to corresponding sense amplifiers 962, respectively.

When a column address indicating a defective bit line is supplied, the column relief circuit 944 may relieve the column address by accessing a redundant bit line instead of the original bit line. An operation of the column relief circuit 944 may be controlled by the column control circuit 932.

The column decoder 954 may select any one of sense amplifiers 962 included in the array 960 based on the address signal. A sense amplifier 962 selected by the column decoder 954 may, for instance, be connected to a read amplifier 958 during a read operation, or to a write amplifier 956 during a write operation. An operation of the read amplifier 958 may be controlled by the read control circuit 938, and an operation of the write amplifier 956 may be controlled by the write control circuit 936.

The data input/output terminal 908 may be configured to provide read data DQ from the memory 900 and receive write data DQ from one or more external devices, such as a memory controller. The data input/output terminal 908 further may be connected to the data output circuit 968 and a data input circuit 966. The data output circuit 968 may be coupled to the read amplifier 958 via a FIFO circuit 972. Therefore, a plurality of read data DQ pre-fetched may be provided in a burst mode from the data input/output terminal 908. The data input circuit 966 may be coupled to the write amplifier 956 via a FIFO circuit 970. Therefore, a plurality of write data DQ provided by the data input/output terminal 908 in the burst mode is simultaneously written into the array 960.

The data strobe terminals 910 may be configured to receive and provide data strobe signals DQS and /DQS, respectively, and may be coupled to both a data strobe signal output circuit 964 and a data strobe signal input circuit 962. The data output circuit 968 and the data strobe signal output circuit 964 may be configured to receive the output clock signal LCLK provided by the DLL circuit 924 and a timing signal provided by the FIFO counter 940.

The power-supply terminals 912 may be configured to receive power supply potentials VDD and VSS, respectively, and may be coupled to an internal voltage generating circuit 980. The internal voltage generating circuit 980 may be configured to generate and/or provide voltages having various magnitudes.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An apparatus comprising:
   a frequency divider configured to receive an input clock signal and adjust a frequency of the clock signal to provide an intermediate clock signal;
   a counter coupled to the frequency divider and configured to receive the intermediate clock signal, the counter further configured to provide an increment count value as a plurality of timing signals based on the intermediate clock signal; and
   a frequency multiplier including a plurality of logic gates, each of the plurality of logic gates coupled to the counter and configured to receive a respective first timing signal of the plurality of timing signals and at least one of the intermediate clock signal or a respective second timing signal of the plurality of timing signals.

2. The apparatus of claim 1, wherein the frequency divider is configured to provide the intermediate clock signal with a frequency lower than a frequency of the input clock signal.

3. The apparatus of claim 1, wherein the frequency multiplier is configured to provide a plurality of output signals based on the plurality of timing signals, each of the plurality of output signals having a frequency that is higher than a frequency of a respective timing signal of the plurality of timing signals.

4. The apparatus of claim 1, wherein the frequency divider is configured to provide the intermediate signal with a frequency that is 1/N times a frequency of the input clock signal, N being a positive number, and wherein the frequency multiplier is configured to provide a plurality of output signals, each of the output signals having a frequency that is N times a frequency of a respective timing signal of the plurality of timing signals.

5. The apparatus of claim 1, wherein the counter comprises:
   a plurality of latches arranged in a series configuration.

6. The apparatus of claim 5, wherein each of the plurality of latches is a D latch.

7. The apparatus of claim 5, wherein the plurality of logic gates comprises:
   an inverter and a NAND gate.

8. The apparatus of claim 1, wherein each of the plurality of logic gates is coupled to a respective output node of the counter.

9. An apparatus comprising:
   a frequency divider configured to receive an input clock signal and decrease a frequency of the input clock signal to provide an intermediate clock signal;
   a counter coupled to the frequency divider and configured to receive the intermediate clock signal, the counter further configured to sequentially provide each of a plurality of timing signals in an overlapping manner based on a number of transitions of the intermediate clock signal, and
   a frequency multiplier coupled to the counter and configured to receive the plurality of timing signals, the frequency multiplier further configured to sequentially provide each of a plurality of output signals based on the plurality of timing signals.

10. The apparatus of claim 9, wherein the counter is further configured to assert a first timing signal of the plurality of timing signals responsive to the intermediate clock signal transitioning to a first logic level and to assert a second timing signal of the plurality of timing signals responsive to the intermediate clock signal transitioning to a second logic level.

11. The apparatus of claim 9, wherein the counter comprises:
    a plurality of latches arranged in a series configuration.

12. The apparatus of claim 11, wherein each of the plurality of latches is a D latch.

13. The apparatus of claim 9, wherein the frequency multiplier comprises:
    a plurality of logic gates, each of the plurality of logic gates configured to provide a respective one of the plurality of output signals.

14. The apparatus of claim 9, wherein the plurality of timing signals provided by the counter are indicative of a number of transitions of the intermediate clock signal.

15. The apparatus of claim 9 wherein the plurality of timing signals provided by the counter are indicative of a number of rising transitions or falling transitions of the intermediate clock signal.

16. An apparatus comprising:
    a counter configured to receive complementary first and second clock signals, wherein the counter comprises a plurality of counter cells, each of the counter cells configured to receive the first and second clock signals and provide a respective timing signal of a plurality of timing signals based on a number of transitions of the first and second clock signals; and
    a frequency multiplier coupled to each of the plurality of counter cells and configured to receive the plurality of timing signals, the frequency multiplier configured to provide a plurality of output signals based on the plurality of timing signals.

17. The apparatus of claim 16, wherein each of the first and second clock signals has a frequency that is 1/N times a frequency of the input clock signal, N being a positive number, and wherein each of the plurality of output signals has a frequency that is N times a frequency of a respective timing signal of the plurality of timing signals.

18. The apparatus of claim 16, further comprising:
    a frequency divider configured to receive an input clock signal and provide the first and second clock signals based on the input clock signals.

19. The apparatus of according to claim 18, wherein a first counter cell of the plurality of counter cells comprises a plurality of inverters and a NAND gate, and wherein a second counter cell of the plurality of counter cells comprises a plurality of inverters and a NOR gate.

20. The apparatus of according to claim 19, wherein each of the plurality of inverters of the first counter cell is configured to receive each of the first and second clock signals and wherein each of the plurality of inverters of the first counter cell is configured to be selectively enabled based on the first and second clock signals.

21. The apparatus of claim 19, wherein at least one of the NAND gate or the NOR gate is configured to hold a respective timing signal of the plurality of timing signals at a logic level responsive to receipt of an asserted reset control signal.

22. The apparatus of claim 16, wherein the frequency divider comprises a plurality of latches arranged in a series configuration.

23. The apparatus of claim 22, wherein each of the counter cells is a D latch.

24. The apparatus of claim 16, wherein the frequency multiplier is configured to provide each of the plurality of output signals based on a respective pair of the plurality of timing signals.

25. The apparatus of claim 16, wherein the frequency multiplier is configured to provide each of the plurality of output signals based on at least one of the first clock signal or the second clock signal and a respective one of the plurality of timing signals.

26. The apparatus of claim 16, wherein the frequency multiplier is configured to provide the plurality of output signals sequentially.

27. An apparatus comprising:
a frequency divider configured to receive an input clock signal, the frequency divider being configured to decrease a frequency of the input clock signal to provide an intermediate clock signal;
a counter coupled to the frequency divider and configured to receive the intermediate clock signal, the counter configured to provide a plurality of timing signals based on a number of transactions of the intermediate clock signal; and
a frequency multiplier coupled to the counter and configured to receive the plurality of timing signals, the frequency multiplier configured to provide a plurality of output signals, each of the plurality of output signals based on a respective one of the plurality of timing signals.

28. The apparatus of claim 27, wherein each of the plurality of output signals is based on a respective another one of the plurality of timing signals.

29. The apparatus of claim 27, wherein the frequency multiplier is coupled to the frequency divider and configured to receive the intermediate clock signal, the frequency multiplier further configured to provide the plurality of output signals based on the intermediate clock signal.

30. A method, comprising:
receiving an input clock signal;
adjusting a frequency of the input clock signal to provide an intermediate clock signal;
providing a plurality of timing signals based on a number of transitions of the intermediate clock signal;
adjusting a frequency of each of the plurality of timing signals to provide a plurality of output signals.

31. The method of claim 30, wherein providing a plurality of timing signals based on the intermediate clock signal comprises:
providing the plurality of timing signals based on the intermediate clock signal and a complement of the intermediate clock signal.

32. The method of claim 30, wherein adjusting a frequency of each of the plurality of timing signals to provide a plurality of output signals comprises:
sequentially asserting each of the plurality of output signals.

* * * * *